United States Patent [19]
Krusin-Elbaum et al.

[11] Patent Number: 5,912,210
[45] Date of Patent: Jun. 15, 1999

[54] ENHANCEMENT OF PERSISTENT CURRENTS IN HIGH TC SUPERCONDUCTORS

[75] Inventors: Lia Krusin-Elbaum, Dobbs Ferry; Alan David Marwick, Yorktown Heights, both of N.Y.; Paul William Lisowski, Los Alamos, N.M.; James Russell Thompson, Jr., Knoxville, Tenn.; James Francis Ziegler, Yorktown Heights, N.Y.

[73] Assignee: International Business Machines Corporation, Armonk, N.Y.

[21] Appl. No.: 08/907,435

[22] Filed: Aug. 8, 1997

Related U.S. Application Data

[63] Continuation of application No. 08/778,647, Jan. 3, 1997, abandoned, which is a continuation of application No. 08/496,102, Jun. 28, 1995, abandoned, which is a continuation of application No. 08/226,624, Apr. 12, 1994, abandoned.

[51] Int. Cl.$^6$ .............................. H01L 39/12; H01L 39/24
[52] U.S. Cl. ......................... 505/121; 505/320; 505/480; 505/230; 505/430; 505/125; 427/62
[58] Field of Search ..................................... 505/320, 230, 505/480, 430, 121, 125; 427/62, 63

[56] References Cited

PUBLICATIONS

Krusin–Elbaum et al, Appl. Phys. Lett. 64(24), Jun. 1994 pp. 3331–3333.

Fleischer et al, Phys, Rev. B. vol. 40, No. 4, Aug. 1989 pp. 2163–2169.

Mezzetti et al, J. Supercond., 5(2) 1992; pp. 185–189.

Schwartz et al, Physical Review B, vol. 48, No. 13, Oct. 1993, pp. 9932–9934.

Liu et al, HTS Mater., Bulk Process. Bulk Appl., Proc. TCSUH Workshop, Edited by C.W. Chu (1992) pp. 343–348.

Kusagaya et al, Adv. Supercond. V. Proc. Int. Symp. Supercond., 5$^{th}$ Meeting Date 1992, pp. 435–438.

Akamatsu et al, Adv. Supercond. V. Proc. Int. Symp. Supercond., 5$^{th}$ Meeting Date 1992, pp. 439–442.

Ling et al, High Temp. Supercond. (BHTSC, '92), Proc. Bejing, Int. Conf., 3$^{rd}$, Meeting Date 1992, pp. 327–329.

*Primary Examiner*—Roy V. King
*Attorney, Agent, or Firm*—Stephen S. Strunck

[57] ABSTRACT

There is disclosed herein an invention for increasing the current carrying capability of high-Tc superconductor materials. The inventive method includes irradiating such superconductors with light particles, such as neutrons, protons and thermal neutrons, having energy sufficient to cause fission of one or more elements in the superconductor material at a dose rate and for a time sufficient to create highly splayed (dispersed in orientation) extended columns of damaged material therein. These splayed tracks significantly enhance the pinning of magnetic vortices thereby effectively reducing the vortex creep at high temperatures resulting in increased current carrying capability.

22 Claims, 3 Drawing Sheets

ENHANCEMENT OF PERSISTENT CURRENTS IN HIGH TC SUPERCONDUCTORS

This is a Continuation of application Ser. No. 08/778, 647, filed on Jan. 3, 1997, now abandoned which is a Continuation application of Ser. No. 08/496,102, filed on Jun. 28, 1995, now abandoned which is a Continuation of Ser. No. 08/226,624, filed on Apr. 12, 1994, now abandoned

BACKGROUND OF THE INVENTION

Large scale applications of high temperature superconductors will require the manufacture of wires or tapes capable of carrying large currents, i.e., such superconductors must have large critical current densities ($J_c$) sustainable at high magnetic fields. In polycrystalline materials and ceramics, $J_c$ is limited by the formation of weak links at the grain boundaries due to the very small superconducting coherence length and the intrinsically high anisotropy. Another limitation comes from a phenomenon known as a "giant flux creep", a large thermal decay of the supercurrent, which exceeds that in conventional superconductors by orders of magnitude. Hence, in these materials, the pinning of the magnetic flux lines, which determines $J_c$, is weak. Thus, enhanced pinning of the magnetic flux lines should lead to enhanced values of $J_c$.

The use of particle irradiation, for example, to introduce additional pinning centers has shown considerable promise. Point defects induced by bombardment with electrons (as reported by Konczykowski, et al in Physia C 162–164, 747 (1989)), fast neutrons (as reported by Sauerzopf, et al in Cryogenics 30, 650 (1990))), or high energy (MeV) protons (as reported by Civale, et al in Phys. Rev. Lett. 65, 1164 (1990)), seem to be effective in raising $J_c$ at low temperatures (4.2K), but they have a much smaller effect on the size of the useful irreversible regime. Irradiation with energetic (GeV) heavy ions, such as Sn, I, Pb, Au or Xe, which produces aligned columnar damage tracks, was shown (by Civale, et al., in Phys. Rev. Lett. 67 648 (1991)) to successfully shift the irreversibility line upward by tens of degrees and to expand the useful regime by several Tesla at high temperatures.

Kumakura et al. in J. Appl. Phys. 72, 800 (1992) report a large effect in tapes of the bismate material $Bi_2Sr_2CaCu_2O_8$ (Bi-2212) after 180 Mev $Cu^{11+}$ irradiation and indicate that the damage by Cu might be columnar. A large expansion of the irreversible regime was recently reported by Civale, et al. in Physica C 208, 137 (1993) in Bi-2223 silver-clad tapes modified by irradiation with 1 GeV Au. More recently, T. Hwa et al in Phys. Rev. Lett. 71, 3545 (1993) proposed that a splay (i.e., a dispersion in the orientation of the columnar defects) should lead to an "entangled" state of the vortex matter in which the dissipation caused by the vortex motion via the hopping and spreading processes would be substantially reduced, resulting in a greatly diminished flux creep and increased critical current density.

BRIEF DESCRIPTION OF THE INVENTION

We have discovered that the damage produced by bombardment of high $T_c$ superconductors with light particles is columnar-like and strongly splayed. Such particles include protons, neutrons, and thermal neutrons. The presence of these tracks produces large increases in the current carrying capability of these superconductors and tens of degrees Kelvin shift in the irreversibility line.

The damage tracks are bored by fragments of nuclei that are fissioned by collisions with such light particles. The fragments recoil with considerable energy. For example, 0.8 GeV protons fission Bi into two fragments, typically Xe with 80 MeV or Kr with 100 MeV, both of which are sufficiently energetic to create extended damage tracks in Bi based superconductors. Generally, because of large resistive anisotropy (large c-axis resistivity), the track formation is expected to be easier along the c-axis direction (lower energy threshold). The advantage of processing with such light particles over the heavy ions is that, depending upon their energy, the projected range can be upwards of nearly a meter, and hence treatment of thick structures is possible. Claddings typically used with these materials in thickness of about 25 $\mu$m or so will be completely transparent to these particles. By contrast, typical heavy ions penetrate to depths of only about 20–30 $\mu$m. The incident ions interact with the solid very differently in the two cases. The light particles induce nuclear fission reactions, while the heavy ions deposit energy directly into the electronic system. An advantage with the use of energetic light particles is that the nuclear processes involved in producing the damage cause less residual radioactivity than is left by irradiation with slower particles, such as thermal neutrons.

BRIEF DESCRIPTION OF THE DRAWINGS

Details of the invention will hereinafter be described, by way of example, with reference to the accompanying drawings, in which.

DETAILED DESCRIPTION OF THE INVENTION

By way of illustration, films of Bi-2212 about 4 $\mu$m thick were prepared on a 25 $\mu$m thick Ag substrate by the partial-melt-growth technique.

Briefly, a stoichiometric aqueous solution of the nitrites of Bi, Sr, Ca and Cu, with a concentration of 0.138M based on calcium, was ultrasonically atomized with oxygen as a carrier gas. The nitrate aerosol was dried by passing it through a tube furnace at 200° C., then deposited electrostatically as a 6–8 $\mu$m thick bluish green coating onto a 10 mm×25 mm×25 $\mu$m silver foil. A deposition temperature of 150° C. was used to prevent water vapor from recondensing on the nitrate particles. The coated Ag foil was heat treated in a tube furnace with the following heat schedule: 220° C. for 30 min, 610° C. for 5 min, 610° C. to 883° C. at 100° C./min, 1–3 minutes at 883° C., 883° C. to 873° C. at 1° C./min, 60 minutes at 873° C., 60 minutes at 868° C., quench to room temperature. The measured thickness of the heat treated tapes was about 50% of the green-coating thickness. The tape preparation process is described in more detail by Li, et al., in Appl. Phys. Lett. 63, 2558 (1993).

The prepared tapes were exposed to 0.8 GeV proton fluences of 1.47, 2.58, and $4.74\times10^{16}$/cm$^2$ at the Los Alamos National Laboratory using the proton beam from LAMPF at the WNR facility. The proton fluences were determined to an accuracy of about 2% from proton induced $^{24}$Na activation of thin aluminum foils placed in front of each sample during irradiation. Fissions were estimated using a Bi density of $8.0\times10^{21}$/cm$^3$ and a Bi fission cross section of 250 mbarns to be 3.3, 5.8, and $10.5\times10^{13}$ fission fragments (f.f.) per cm$^3$, respectively.

Figure 1:
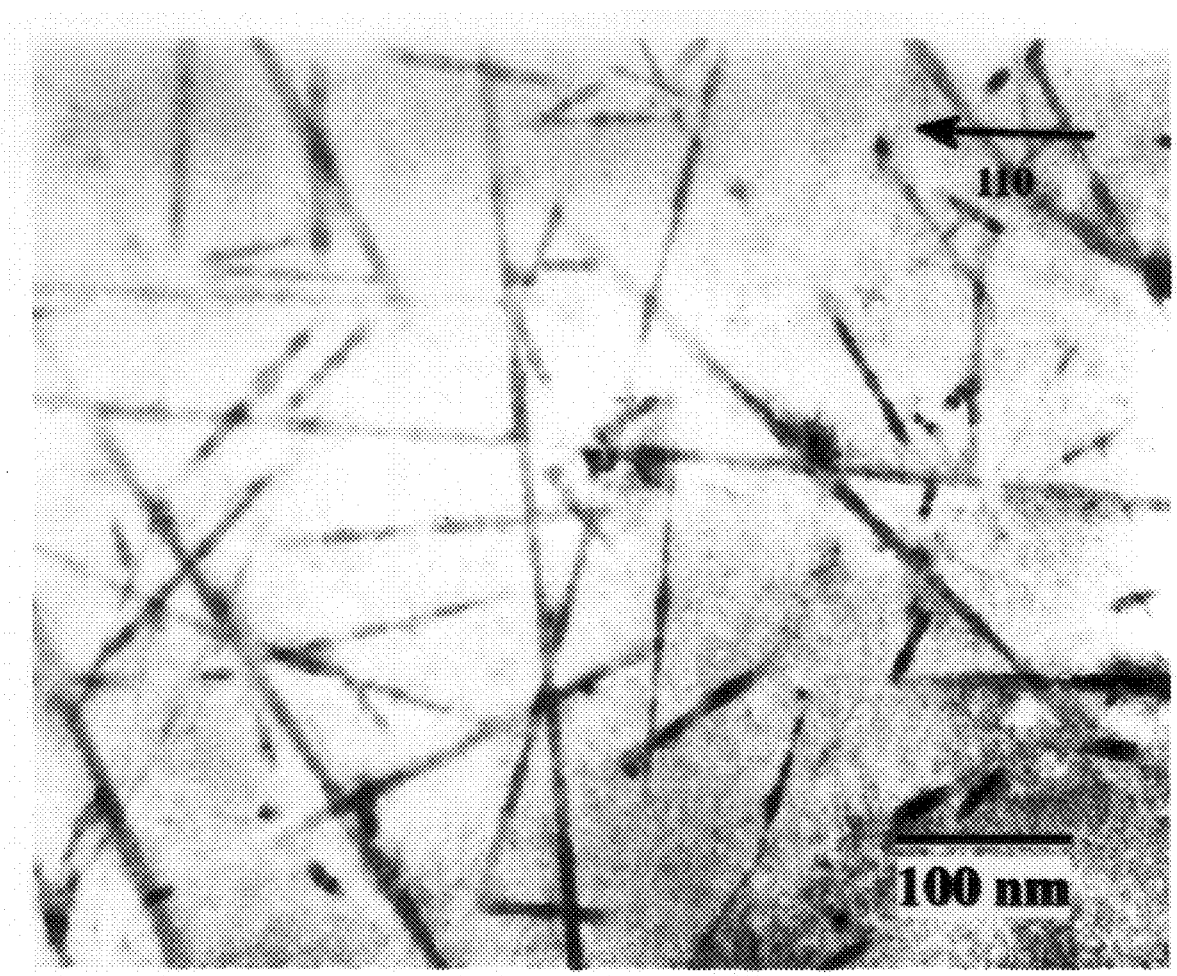
FIG. 1 is a transmission electron micrograph of a Bi-2212 tape irradiated with 0.8 GeV protons, viewed along the irradiation direction and perpendicular to the tape plane, showing randomly oriented continuous columnar defects with a diameter of about 70 Å.

FIG. 1 is a transmission electron microscope (TEM) image of the tape viewed along the irradiation direction and perpendicular to the tape plane for a sample irradiated with a nominal dose of $3.3\times10^{13}$ f.f./cm$^3$. FIG. 1 distinctly shows the columnar nature of the damage with the maximum diameter being on the order of about ~7 nm. The tracks are long. The defect density obtained from TEM is about $2.0\times10^{10}$/cm$^2$, which would imply a mean track length of about 6.1 $\mu$m, larger than the tape thickness. This is not unreasonable since the total range is 7 $\mu$m for 80 MeV Xe, and 12 $\mu$m for 100 MeV Kr. The tracks are also distinctly splayed with a large occurrence of splay angles greater than 20° (assuming all tracks traverse the thickness of the tape). Thus the damage produced by fission fragments generated by such protons is spectacularly different from the uniform damage present in the irradiated uranium doped materials of Luborsky et al. as reported in J. Mater. Res. 6, 28 (1991).

Figure 2A:
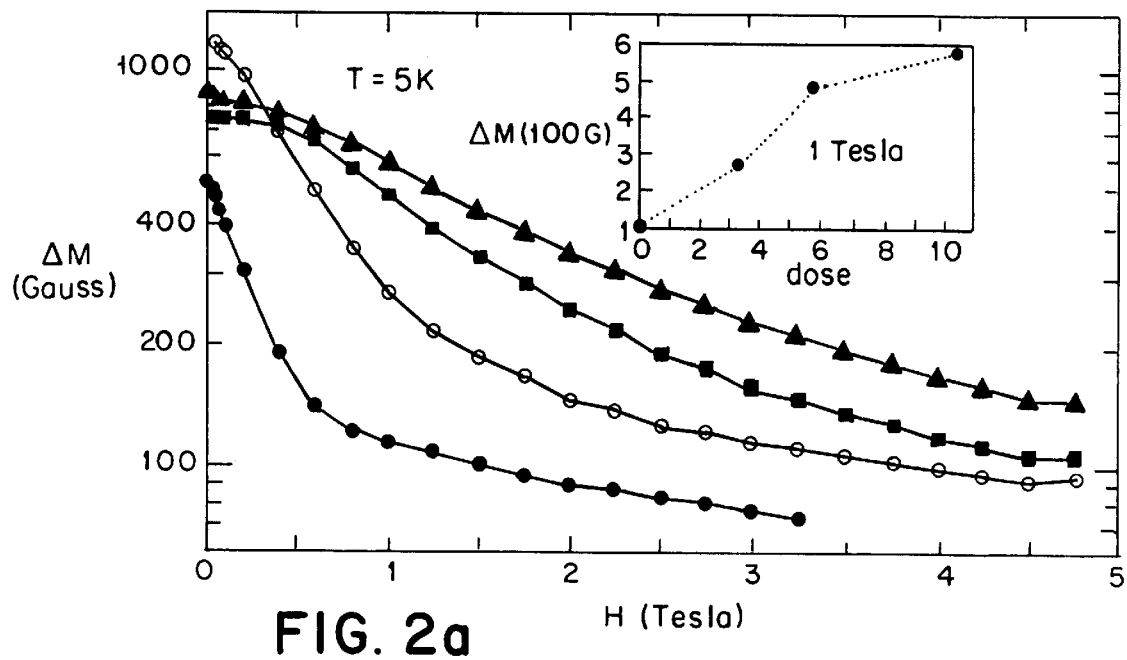
FIG. 2 is a graph of $\Delta M \alpha J$ vs applied field for Bi-2212/Ag c-axis oriented tapes at (a)T=5K and (b) at T=30K before and after irradiation with 0.8 GeV protons. Inset: dose dependence (in units of $10^{13}$ f.f./$cm^3$) of $\Delta M$, at 5K.
Figure 2B:
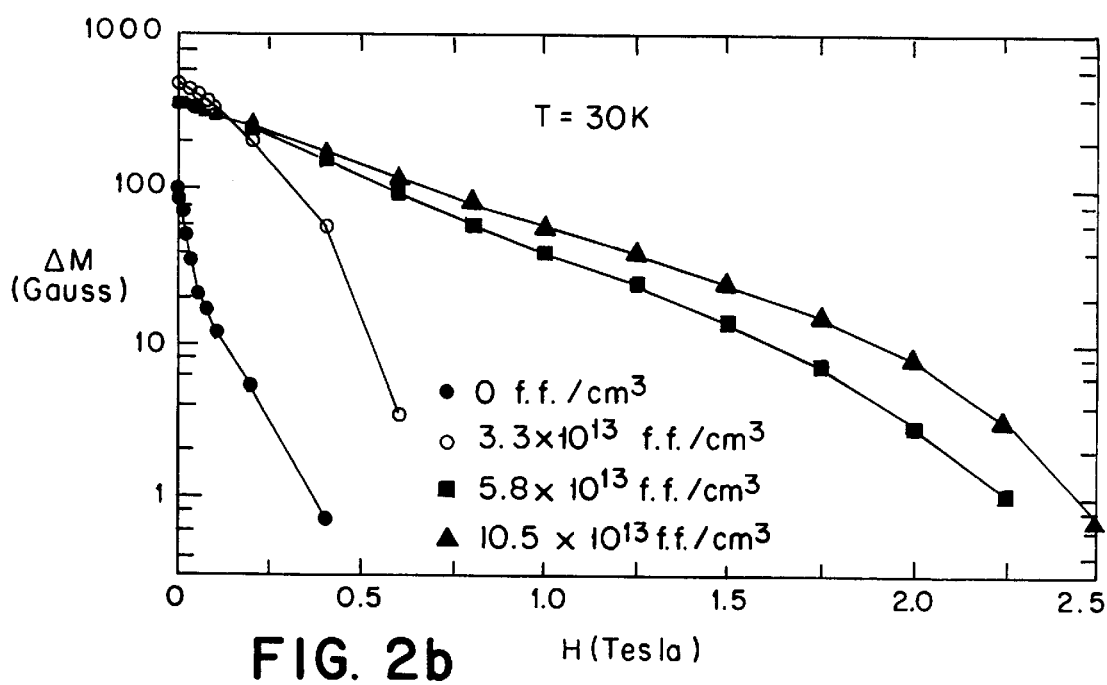

The samples were characterized before and after irradiation with measurements of magnetic moment m(H,T), made with a superconducting quantum interference device (SQUID) magnetometer in fields up to 5.5 Tesla applied normal to the tape. A very large increase in the width of the hysteresis loop $\Delta$m after irradiation with 0.8 GeV protons is illustrated in FIG. 2, where the field variation of $\Delta M = \Delta m/V$ (V is the volume of superconductor) is plotted on a log-linear scale. In FIG. 2, the fission densities of 3.3, 5.8, and $10.5\times10^{13}$ f.f./cm$^3$ correspond to areal densities of 2.0, 3.5, and $6.5\times10^{10}$ f.f./cm$^2$ respectively. The hysteresis in magnetization $\Delta M$ is related to a persistent current density J via a geometrical factor, $\Delta M \alpha J$. As shown in FIG. 2A, at T=5K and at low fields, $\Delta M$ increased from its pre-irradiation value by more than twofold for the highest irradiation dose. At higher fields, as is shown in the inset to FIG. 2A, the low temperature magnetization increased monotonically with dose and the increase become dramatic; for H=1 Tesla, an increase in $\Delta M$ by a factor of about 6 is apparent for the largest dose ($10^{14}$/cm$^3$) used. As shown in FIG. 2B, the effect is even more spectacular at high temperatures; before irradiation, the persistent current density is already immeasurably small at 30K, but irradiation with the highest doses gave $\Delta M$ values at 30K comparable in magnitude with those at 5K.

Figure 3:
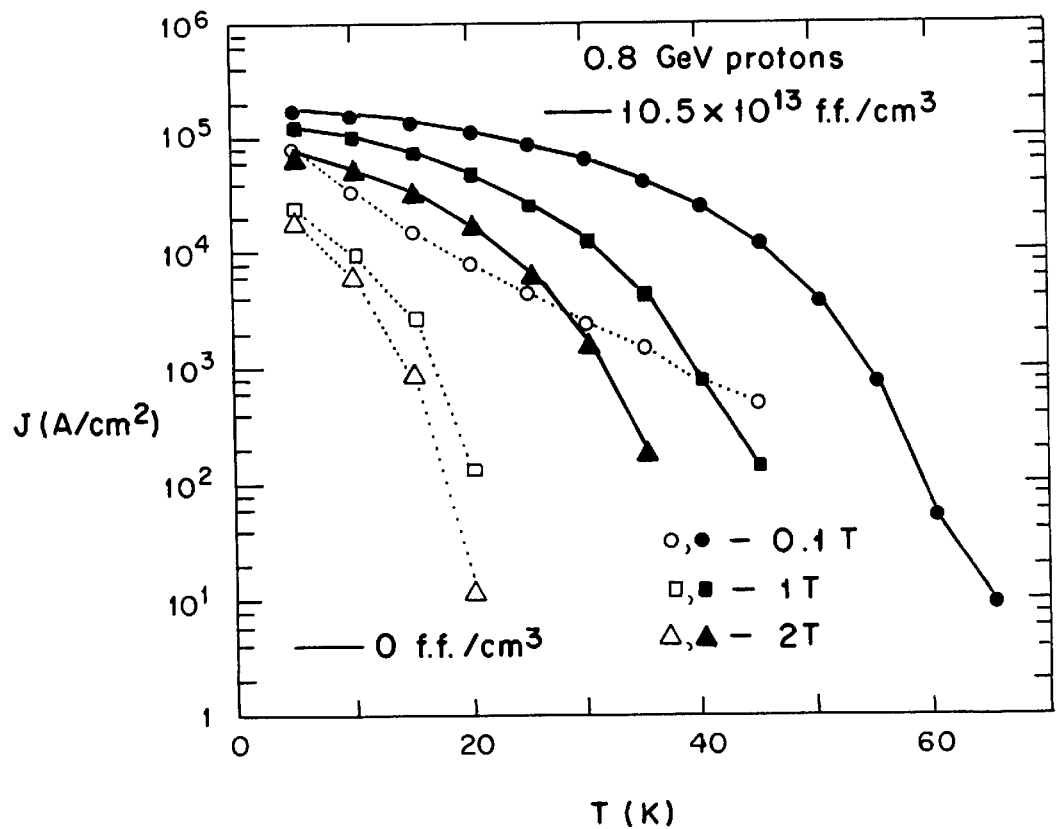
FIG. 3 is a graph of the persistent current density J vs temperature for a Bi-2212 tape sample after processing with $6.5 \times 10^{10}$ f.f./$cm^2$ for three values of magnetic field applied normal to the tape.
Figure 4:
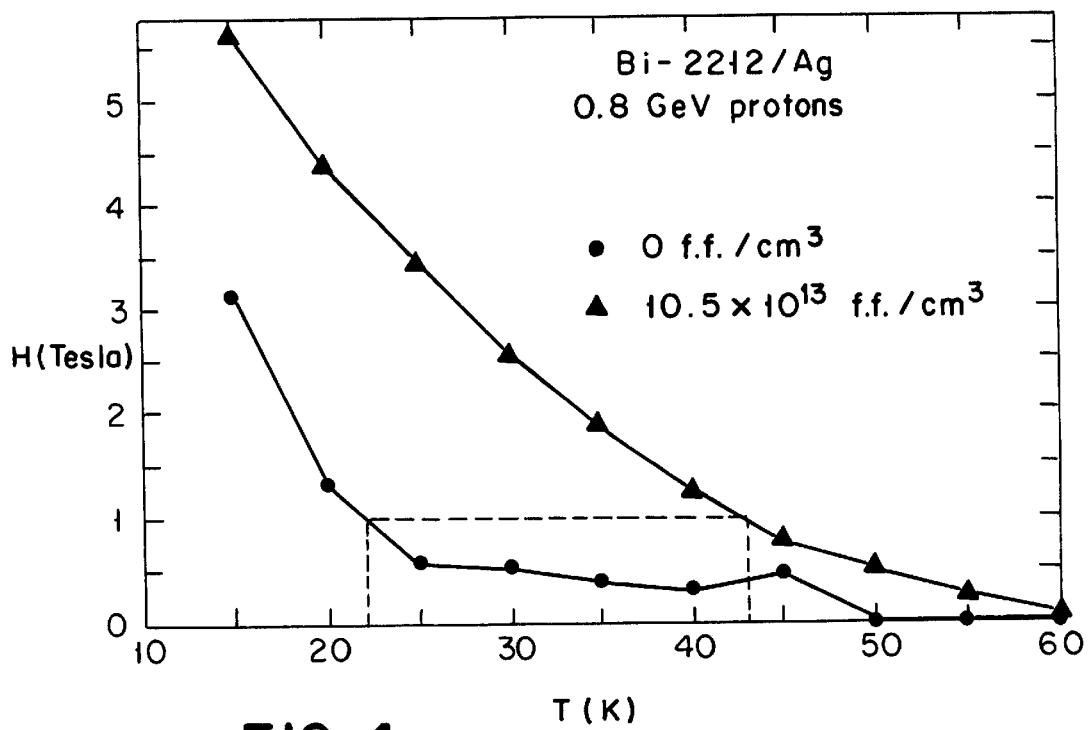
FIG. 4 is a graph of applied field versus temperature which shows the irreversibility lines of unirradiated and 0.8 GeV proton irradiated Bi-2212 tapes.

FIG. 3 shows the temperature dependence of the persistent current density J before and after irradiation that resulted in a dose of $10.5\times10^{13}$ f.f./cm$^3$ for three different values of magnetic field. J was estimated via the Bean model, J=15 $\Delta$m/(V R), where R is the effective radius of the sample (for these samples, R=1.5mm and thickness is 3.1 $\mu$m). Before irradiation, J falls off very rapidly with temperature, as is also seen in Bi-2212 single crystals, with H parallel to the c-axis. This precipitous fall is clearly arrested after irradiation and a spectacular expansion of the irreversible regime towards higher temperatures is apparent from FIG. 3; at 1 Tesla field and T=20K, the increase in J is nearly three orders of magnitude. Indeed, at low fields J remains measurable up to 70K. Thus, the persistent current density becomes large in the regions above the irreversibility line of unirradiated samples. The expansion of the irreversible regime is illustrated in FIG. 4 which also shows the irreversibility lines of irradiated and unirradiated samples. The irreversibility line was defined at the closing of the hysteresis loop m(H) at each temperature with the criterion of $5\times10^{-6}$ emu, corresponding to about 20A/cm$^2$, using (as before) the size of the sample as the relevant current loop dimension. At 1 Tesla, the upward shift of the irreversible regime is about 22K as compared with about a 24K shift obtained in B-2212 single crystals irradiated with 0.58 GeV Sn$^{30+}$ ions with the dose of $2.4\times10^{11}$ions/cm$^2$, equivalently expressed in terms of a matching field $B_\Phi$=5 Tesla as reported by Thompson, et al., in Appl. Phys. Lett 60, 2306 (1992).

Both the enhancement of J at high fields and temperatures and the shift of the irreversibility line are of the same order as obtained by Civale, et al., in Physica C 208, 137 (1993), with irradiation with 1.08 GeV Au$^{23+}$ of Bi-2223 tapes, at a dose of $1.7\times10^{11}$ ions/cm$^2$ ($B_{101}$ =3.5 Tesla), where defects are aligned and the splay of the columnar tracks is very small (less than about 1°). Remarkably, the effective doses which produce the effects of the present invention are about a factor of three smaller. The highest dose of this invention corresponds to an areal density of $6.5\times10^{10}$ f.f./cm$^2$, or $B_{101}$ equal to about 1.4 Tesla, if it is assumed that tracks go most of the way through the tape. Thus, the strongly splayed tracks of the present invention are more efficient. We theorize that the reason for the effectiveness of the columnar tracks in general (compared with point defects) is that a much longer portion of the vortex core is confined by the defect and that the pinning forces from individual defects add up directly, rather than via spatial fluctuations in the order parameter. One bonus of irradiation with energetic protons is a rather substantial splay in the track direction which appears to boost both J and the size of the irreversible region, possibly by arresting the creep of vortices from the tracks.

Irradiation with energetic light particles can significantly enhance the pinning of magnetic vortices in superconducting ceramic tapes, by creating highly splayed extended columns of damaged material, in which superconductivity has been largely suppressed. These splayed tracks provide better pinning of vortices since they confine a longer section of the vortex core and effectively reduce the vortex at high temperatures. These damage tracks are bored by fragments of nuclei that are fissioned by collisions with light particles including protons and neutrons, and further including thermal neutrons. Thermal neutrons are used primarily to improve the performance of superconducting materials manufactured with fissile material, such as U$^{235}$, either as a constituent element of the superconductor or as a dopant. In the case of Bi-2212, the fissionable element, (Bi) is inherent in the chemistry of the superconductor. Likewise, Bi is the fissionable element in Bi-2223 superconductors. The invention extends to other superconductor compositions, such as those based on mercury (e.g. HgBaCaCuO) and the thallates (e.g., Tl$_2$Ba$_2$CaCuO$_8$), having fissionable constituent atoms (Hg) and (Tl), respectively. Since the fission cross section varies as a function of incident particle energy, the effect becomes larger as incident particle energy increases up to the point where the fission cross section reaches a maximum. It is also contemplated that the fissionable atoms can be seeded or doped into superconductors, such as YBaCuO, which have no effective fissionable atoms.

The commercial potential of this technique is in the long penetration length of the GeV light particles, which will allow modification of superconducting tapes (thickness small compared to tape width), wires and other shapes where the thickness is large compared to the width, and even machinery which would be irradiated after fabrication.

All of the technical articles cited in the foregoing specification are incorporated herein by reference as though fully set forth herein.

Having thus described our invention, what we claim as new, and desire to secure by Letters Patent is:

1. A method for enhancing the current carrying capacity of high temperature superconductors including the steps of:
   a) providing a high temperature superconductor having one or more elements inherent in the composition of the superconductor fissionable by light particles selected from the group consisting of neutrons, thermal neutrons and protons; and
   b) irradiating said superconductor with said light particles, said particles having energy sufficient to cause fission of said one or more elements and at a dose rate and for a time sufficient to create highly splayed extended columns of damaged material therein effective at enhancing the current carrying capacity Jc.

2. The method of claim 1 wherein said light particles are protons.

3. The method of claim 1 wherein said light particles are neutrons.

4. The method of claim 1 wherein the energy of said particles is in the MeV to GeV range.

5. The method of claim 4 wherein said superconductor is Bi-2212.

6. The method of claim 4 wherein said superconductor is Bi-2223.

7. The method of claim 1 wherein said superconductor is clad.

8. The method of claim 1 wherein said superconductor is provided in the form of a solid body having a thickness to width ratio equal to or less than one.

9. The method of claim 1 wherein said superconductor is provided in the form of a solid body having a thickness to width ratio greater than one.

10. The method of claim 1 wherein the energy of said particles is in about the 0.8 GeV to 1 GeV range.

11. The method of claim 1 wherein said light particles are protons with energies in about the 0.8 GeV to 1 Gev range.

12. The product made by the process of claim 1.

13. The method for enhancing the current carrying capacity of undoped bismate superconductors by irradiating the same with light particles selected from the group consisting of neutrons, protons and thermal neutrons at sufficient energy levels to cause fission in the superconductors of Bi and Xe or Kr to create highly splayed extended columns of damaged materials effective to enhance current carrying capacity.

14. The method of claim 13 wherein said light particles are neutrons.

15. The method of claim 14 wherein said neutrons are thermal neutrons.

16. The method of claim 13 wherein said light particles are protons.

17. The method of claim 16 wherein said protons have an energy of about 0.8 GeV.

18. The method of claim 16 wherein the fluence of said protons is from about $1\times10^{16}/cm^2$ to about $5\times10^{16}/cm^2$.

19. The method of claim 13 wherein said superconductor is clad.

20. The method of claim 19 wherein said cladding is silver.

21. The method of claim 13 wherein said bismate is Bi-2212.

22. The method of claim 13 wherein said bismate is Bi-2223.

* * * * *